(12) United States Patent
Huemiller et al.

(10) Patent No.: US 12,040,461 B2
(45) Date of Patent: Jul. 16, 2024

(54) CAPACITANCE-BASED QUALITY MONITORING AND CONTROL IN BATTERY MANUFACTURING

(71) Applicant: GM Global Technology Operations LLC, Detroit, MI (US)

(72) Inventors: Erik Damon Huemiller, Waterford, MI (US); Michael P. Balogh, Novi, MI (US); Ryan Curtis Sekol, Grosse Pointe Woods, MI (US); Ratandeep Singh Kukreja, Warren, MI (US); Shaomao Xu, Sterling Heights, MI (US); Andrew J. Galant, Shelby Township, MI (US); Nicholas Paul William Pieczonka, Windsor (CA); Daad Bourhan Haddad, Warren, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 358 days.

(21) Appl. No.: 17/555,841

(22) Filed: Dec. 20, 2021

(65) Prior Publication Data
US 2023/0198034 A1    Jun. 22, 2023

(51) Int. Cl.
| | |
|---|---|
| *H01M 10/48* | (2006.01) |
| *G01B 7/06* | (2006.01) |
| *G01N 27/22* | (2006.01) |
| *G01R 27/26* | (2006.01) |
| *H01M 4/04* | (2006.01) |
| *H01M 10/04* | (2006.01) |

(52) U.S. Cl.
CPC ............ *H01M 10/48* (2013.01); *G01B 7/085* (2013.01); *G01N 27/221* (2013.01); *G01R 27/2605* (2013.01); *H01M 4/0402* (2013.01); *H01M 10/04* (2013.01); *H01M 2220/20* (2013.01)

(58) Field of Classification Search
CPC .... H01M 10/48; H01M 10/04; H01M 4/0402; G01B 7/085; G01N 27/221; G01N 27/24; G01R 27/2605
See application file for complete search history.

(56) References Cited

U.S. PATENT DOCUMENTS

| | | | | |
|---|---|---|---|---|
| 6,020,264 | A | * | 2/2000 | Lustig ..................... H01L 22/20 438/692 |
| 2016/0216224 | A1 | * | 7/2016 | King ..................... G01N 27/24 |

FOREIGN PATENT DOCUMENTS

| | | | |
|---|---|---|---|
| CN | 107638987 A | * | 1/2018 |
| KR | 100865401 B1 | * | 10/2008 |

* cited by examiner

*Primary Examiner* — Daniel McNally
(74) *Attorney, Agent, or Firm* — CANTOR COLBURN LLP

(57) ABSTRACT

A quality control system in a battery manufacturing process includes two or more capacitive measurement apparatuses to obtain a capacitance measurement from two or more intermediate products generated during the battery manufacturing process. The system also includes processing circuitry to obtain the capacitive measurement from the two or more capacitive measurement apparatuses, to determine a characteristic of the corresponding intermediate product, and to control at least one process of the battery manufacturing process that produced at least one of the two or more intermediate products based on the characteristic.

20 Claims, 7 Drawing Sheets

CAPACITANCE-BASED QUALITY MONITORING AND CONTROL IN BATTERY MANUFACTURING

INTRODUCTION

The subject disclosure relates to capacitance-based quality monitoring and control in battery manufacturing.

Battery cells are increasingly used in hybrid and autonomous vehicles, for example. Battery cells may be packaged together into a module and modules may be combined into a pack. Any number of cells may be stacked in series to obtain a vehicle battery. Manufacture of the battery includes several processes involved in electrode assembly, cell assembly, and formation (i.e., the initial charge/discharge operation). A quality issue for an intermediate product generated by any one of the processes may affect the quality of the resulting battery. Accordingly, it is desirable to provide capacitance-based quality monitoring and control in battery manufacturing.

SUMMARY

In one exemplary embodiment, a quality control system in a battery manufacturing process includes two or more capacitive measurement apparatuses configured to obtain a capacitance measurement from two or more intermediate products generated during the battery manufacturing process. The system also includes processing circuitry to obtain the capacitive measurement from the two or more capacitive measurement apparatuses, to determine a characteristic of a corresponding intermediate product among the two or more intermediate products, and to control at least one process of the battery manufacturing process that produced at least one of the two or more intermediate products based on the characteristic.

In addition to one or more of the features described herein, one of the two or more capacitive measurement apparatuses includes one or more conductive plates arranged at a first side of the corresponding intermediate product and one or more conductive plates arranged at a second side of the corresponding intermediate product and also includes a meter to measure capacitance between the one or more conductive plates arranged at the first side and the one or more conductive plates arranged at the second side of the corresponding intermediate product.

In addition to one or more of the features described herein, the processing circuitry determines thickness of a portion of the corresponding intermediate product as the characteristic.

In addition to one or more of the features described herein, the one of the two or more capacitive measurement apparatuses include two or more conductive plates at the first side and one or more conductive plates at the second side of the corresponding intermediate product, and the processing circuitry determines the thickness of a wet slurry applied in an electrode coating process to produce the corresponding intermediate product.

In addition to one or more of the features described herein, the processing circuitry determines the thickness of the portion of the corresponding intermediate product resulting from a roll press, the thickness indicating porosity and density.

In addition to one or more of the features described herein, the processing circuitry controls pressure exerted by the roll press based on the thickness.

In addition to one or more of the features described herein, the processing circuitry determines a dielectric constant of material in the corresponding intermediate product as the characteristic.

In addition to one or more of the features described herein, one of the two or more capacitive measurement apparatuses includes a meter to measure capacitance between anodes and cathodes formed for the battery.

In addition to one or more of the features described herein, one of the two or more capacitive measurement apparatuses includes a meter to measure capacitance between anodes or cathodes formed for the battery and a frame holding the intermediate product.

In addition to one or more of the features described herein, one of the two or more capacitive measurement apparatuses includes a meter to measure capacitance between a movable plate and a frame, and the processing circuitry estimates a volume of discharged gas based on the capacitance.

In another exemplary embodiment, a method of assembling a quality control system in a battery manufacturing process includes arranging two or more capacitive measurement apparatuses to obtain a capacitance measurement from two or more intermediate products generated during the battery manufacturing process. The method also includes configuring processing circuitry to obtain the capacitive measurement from the two or more capacitive measurement apparatuses, to determine a characteristic of a corresponding intermediate product among the two or more intermediate products, and to control at least one process of the battery manufacturing process that produced at least one of the two or more intermediate products based on the characteristic.

In addition to one or more of the features described herein, the arranging the two or more capacitive measurement apparatuses includes one of the two or more capacitive measurement apparatuses including one or more conductive plates arranged at a first side of the corresponding intermediate product and one or more conductive plates arranged at a second side of the corresponding intermediate product and also includes a meter configured to measure capacitance between the one or more conductive plates arranged at the first side and the one or more conductive plates arranged at the second side of the corresponding intermediate product.

In addition to one or more of the features described herein, the configuring the processing circuitry includes the processing circuitry determining thickness of a portion of the corresponding intermediate product as the characteristic.

In addition to one or more of the features described herein, the arranging the two or more capacitive measurement apparatuses includes one of the two or more capacitive measurement apparatuses including two or more conductive plates at the first side and one or more conductive plates at the second side of the corresponding intermediate product, and the configuring the processing circuitry includes the processing circuitry determining the thickness of a wet slurry applied in an electrode coating process to produce the corresponding intermediate product.

In addition to one or more of the features described herein, the configuring the processing circuitry includes the processing circuitry determining the thickness of the portion of the corresponding intermediate product resulting from a roll press, the thickness indicating porosity and density.

In addition to one or more of the features described herein, the configuring the processing circuitry includes the processing circuitry controlling pressure exerted by the roll press based on the thickness.

In addition to one or more of the features described herein, the configuring the processing circuitry includes the processing circuitry determining a dielectric constant of material in the corresponding intermediate product as the characteristic.

In addition to one or more of the features described herein, the arranging the one of the two or more capacitive measurement apparatuses includes arranging a meter to measure capacitance between anodes and cathodes formed for the battery.

In addition to one or more of the features described herein, the arranging the two or more capacitive measurement apparatuses includes one of the two or more capacitive measurement apparatuses including a meter to measure capacitance between anodes or cathodes formed for the battery and a frame holding the intermediate product.

In addition to one or more of the features described herein, one of the two or more capacitive measurement apparatuses includes a meter to measure capacitance between a movable plate and a frame, and the configuring the processing circuitry includes the processing circuitry estimating a volume of discharged gas based on the capacitance.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
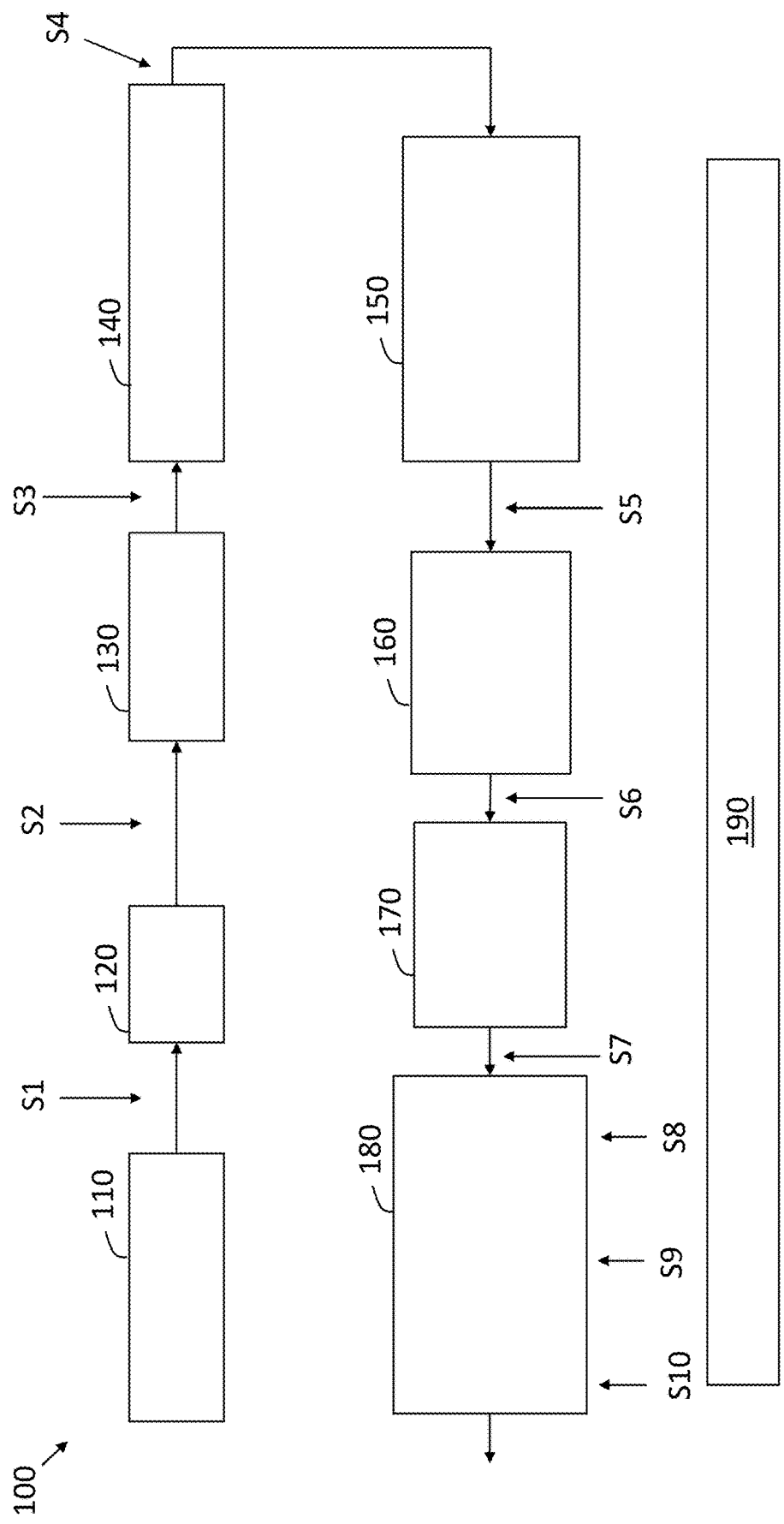
FIG. 1 is a process flow of battery manufacturing that includes capacitance-based quality monitoring and control according to one or more embodiments.

The following description is merely exemplary in nature and is not intended to limit the present disclosure, its application or uses. It should be understood that throughout the drawings, corresponding reference numerals indicate like or corresponding parts and features.

As previously noted, battery manufacturing (e.g., of cells of a vehicle battery) includes several processes. Embodiments of the systems and methods detailed herein relate to capacitance-based quality monitoring and control in battery manufacturing. Generally, in a parallel plate arrangement of conductive plates separated by a dielectric with the conductive plates having an area of overlap A, separated by a distance d (in meters), with an electric constant $\varepsilon_0$ (approximately $8.854 \times 10^{-12}$ Farad per meter), and with the dielectric having a dielectric constant K, the capacitance is given by:

$$C = \frac{\varepsilon_0 K A}{d} \quad [\text{EQ. 1}]$$

As detailed, the capacitance-based monitoring may be implemented on intermediate products resulting from processes at different stages of manufacturing. According to the exemplary embodiments, the distance d (indicating a thickness of an intermediate product) or dielectric constant K (indicating material quality or property of the intermediate product) may be determined by measuring the capacitance. One or more of the processes may be controlled based on the monitoring.

Figure 2:
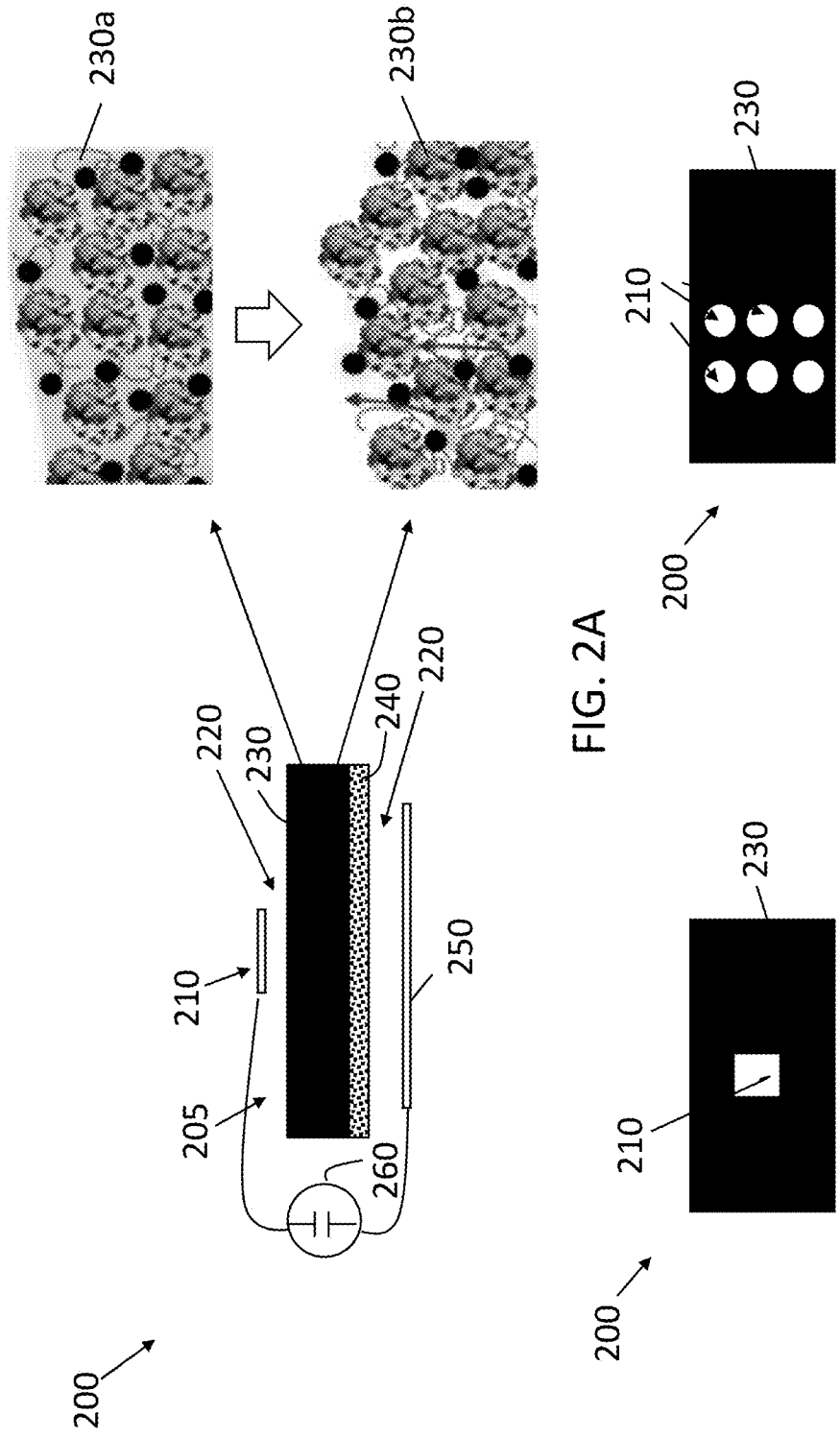
FIG. 2A shows aspects of an exemplary capacitive measurement apparatus used for capacitance-based monitoring at one or more stages of battery manufacturing according to one or more embodiments.
FIG. 2B shows a top-down view of the capacitive measurement apparatus shown in FIG. 2A.
FIG. 2C shows a top-down view of another exemplary capacitive measurement apparatus according to one or more embodiments.

In accordance with an exemplary embodiment, FIG. 1 is a process flow 100 of an exemplary battery manufacturing procedure that includes capacitance-based quality monitoring and control. Monitoring stages according to one or more embodiments are indicated as S1-S10. Fewer or more monitoring stages S1-S10 may be used and may be warranted, for example, by modifications in the battery manufacturing processes. Processing circuitry 190 is also indicated. This processing circuitry 190 may be centralized or distributed within the manufacturing facility and may be coupled with each capacitive measurement apparatus 200 (FIG. 2), 400 (FIG. 4), 500 (FIG. 5), 600 (FIG. 6), 700 (FIG. 7) that is used at any or all of the monitoring stages S1-S10.

In addition, as discussed, one or more processes 110-180 may additionally involve control implemented via the processing circuitry 190 based on the monitoring at one of the stages S1-S10. The processing circuitry 190 may include an application specific integrated circuit (ASIC), an electronic circuit, a processor (shared, dedicated, or group) and memory that executes one or more software or firmware programs, a combinational logic circuit, and/or other suitable components that provide the described functionality. The memory may be in the form of non-transitory computer-readable media that stores instructions which, when processed by one or more of the processors, execute aspects of the methods detailed herein.

The processes shown at blocks 110 through 140 pertain to formation of electrodes (i.e., anodes 410 and cathodes 420 (FIG. 4)). At block 110, the processes include applying a wet slurry coating 230 (FIG. 2A) to a plate 240 (FIG. 2A) (e.g., copper, aluminum foil). The plate 240 may be referred to as a current collector in a battery cell. Following the application at block 110, at the monitoring stage S1, the capacitive measurement apparatus 200 (FIG. 2A) may be used to measure capacitance on the resulting intermediate product and determine a thickness or a dielectric constant of the wet slurry coating 230 according to EQ. 1, as further discussed with reference to FIG. 2A. At block 120, the processes include drying the coated plate 240 in an oven. Following the drying process at block 120, at monitoring stage S2, the same or a similar capacitive measurement apparatus 200 as is used at monitoring stage S1 may be used to measure capacitance on the resulting intermediate product and determine the dielectric constant and/or thickness of the dried coating 230 according to EQ. 1, as also discussed with reference to FIG. 2A. The processes at blocks 110 and 120, as well as the monitoring stages S1 and S2, may be repeated to coat the other side of the plate 240 and provide a coated plate 305 (FIG. 3) as the intermediate product.

Figure 3:
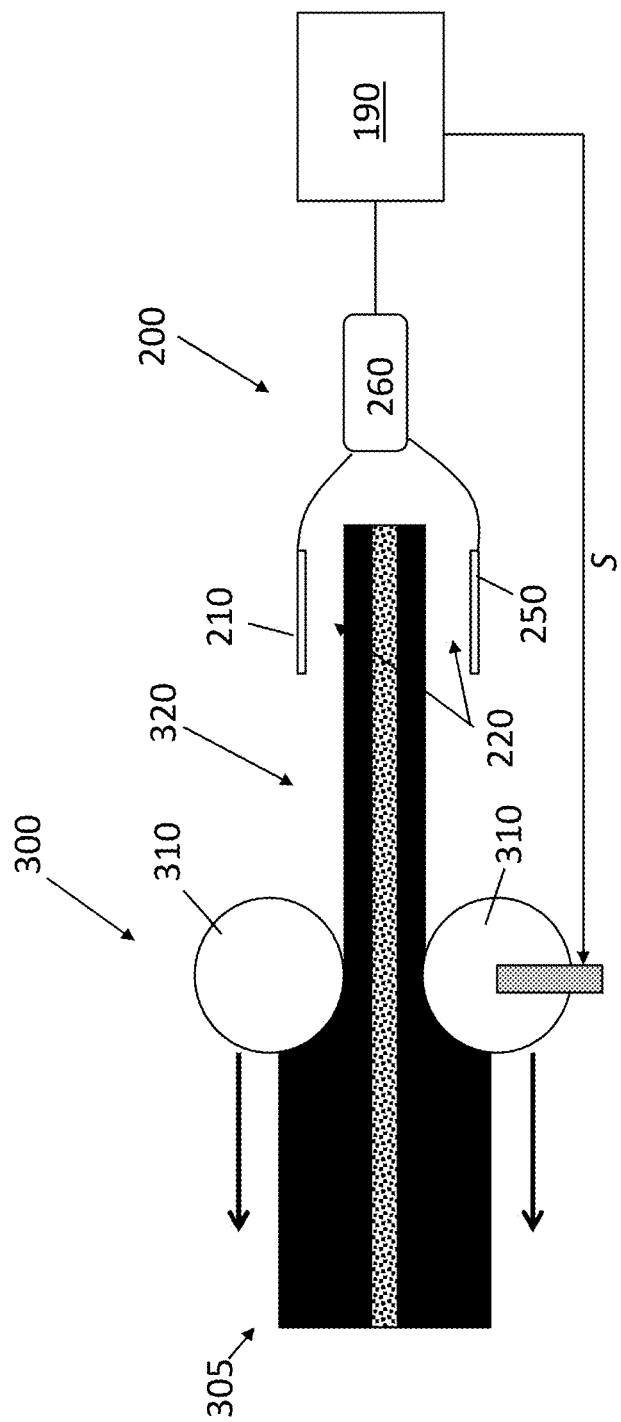
FIG. 3 shows aspects of an exemplary capacitive measurement apparatus used at a monitoring stage according to one or more embodiments.

At block 130, the processes include putting the coated plate 220 through a roll press 300 (FIG. 3). A monitoring stage S3 follows the roll press, at block 130. The monitoring stage S3 may involve the same or a similar capacitive measurement apparatus 200 as the one used at monitoring stages S1 and S2. Capacitance of the intermediate product resulting from the roll press may be used to determine thickness, which indicates porosity and density. The processing circuitry 190 may use the thickness determination as feedback to control the roll press 300 (e.g., to bring the rollers 310 (FIG. 3) closer together) to decrease the thickness of the resulting intermediate product or to control the roll press 300 (e.g., move the rollers 310 farther apart) to increase the thickness. This is further discussed with reference to FIG. 3.

At block 140, performing slitting, notching, and vacuum drying results in cell electrodes (i.e., anodes 410, cathodes 420). At monitoring stage S4, a capacitive measurement apparatus 200 may be used in a way similar to the use at monitoring stage S2 to determine dielectric constant and, consequently, determine if the drying process is complete.

The processes shown at blocks 150 through 170 generally relate to assembly. At block 150, the lamination of an anode 410 and cathode 420 followed by folding results in a dry cell stack 430 (i.e., without electrolyte 610 (FIG. 6)). Following this process, at the monitoring stage S5, capacitance may be measured to determine if the area of overlap of the anodes 410 and cathodes 420 in the stack 430 is consistent. This is further discussed with reference to FIG. 4 and the capacitance measurement apparatus 400.

At block 160, processes such as welding, putting the stack 430 in a pouch 510 (FIG. 5), and sealing three sides results in an intermediate product 505 (FIG. 5) that is tested at monitoring stage S6. The capacitance measurement apparatus 500 shown in FIG. 5 may be used or a capacitance measurement apparatus 400 reused or replicated from the monitoring stage S5 to determine characteristics of the intermediate product 505.

Figure 5:
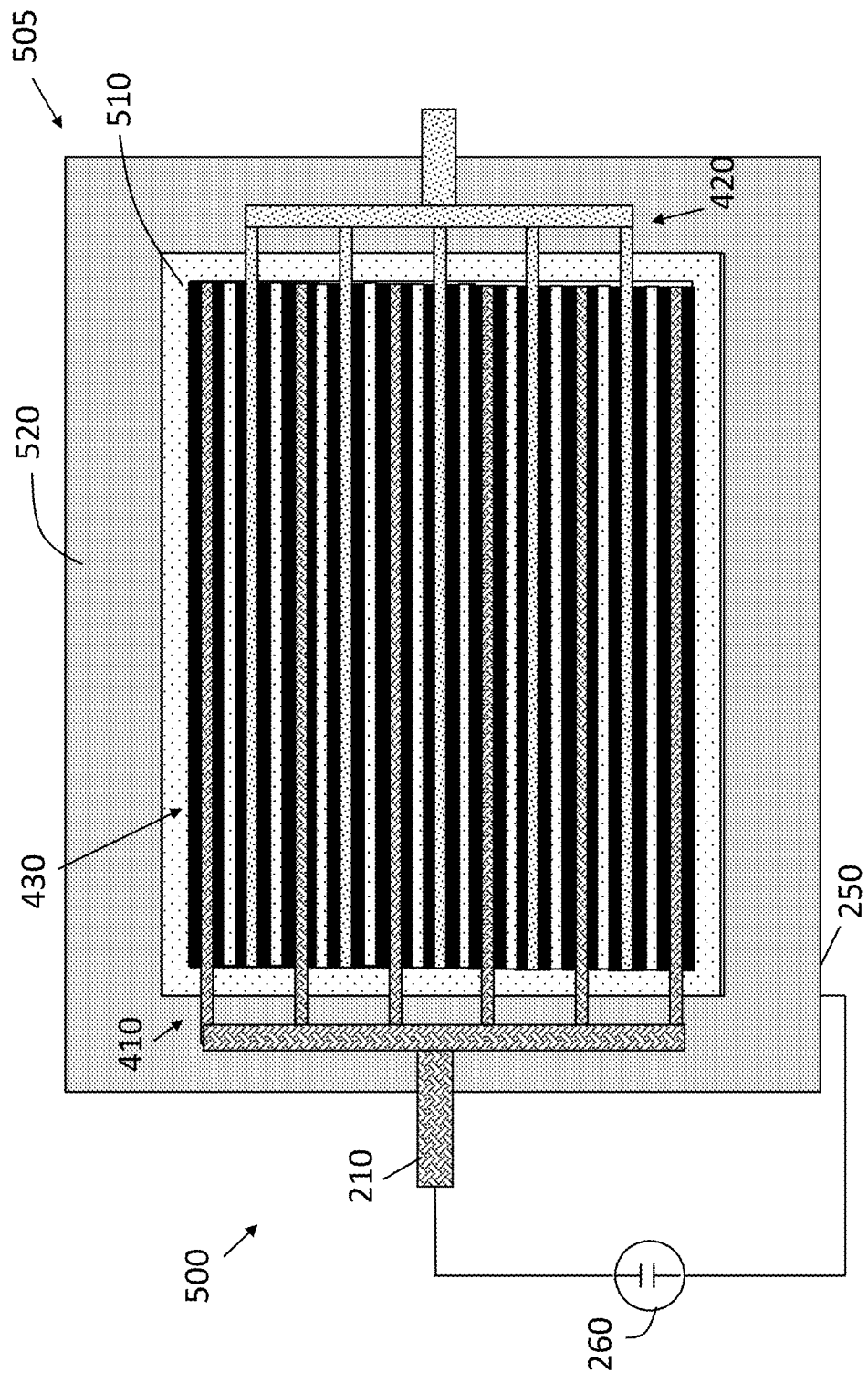
FIG. 5 shows aspects of an exemplary capacitive measurement apparatus used for capacitance-based monitoring at one or more stages of battery manufacturing according to one or more embodiments.

At block 170, the processes include pouring electrolyte 610, sealing the pouch 510, and packaging. The pouch 510 may be packaged in a frame 520, as shown in FIG. 5, to complete the assembly process. The intermediate product resulting from the assembly may be checked at the monitoring stage S7. Specifically, at the monitoring stage S7, the capacitance value may be used to monitor the diffusion of the electrolyte 610 into the stack 430. This monitoring may employ the same or a similar capacitance measurement apparatus 500 used at the monitoring stage S6.

At block 180, the processes include formation, which refers to performing an initial charge/discharge operation, degassing the gas generated during the formation process as a by-product of the solid-electrolyte interphase, and performing the final, end-of-line checks. As indicated, monitoring stages S8, S9, and S10 may be included among the processes at block 180. Specifically, the monitoring stage S8 is associated with formation, as further discussed with reference to FIG. 6, the monitoring stage S9 is associated with degassing, as further discussed with reference to FIG. 7, and the monitoring stage S10 may use the same or a similar capacitance measurement apparatus 600 used at the monitoring stage S8.

FIGS. 2A, 2B, and 2C show aspects of a capacitive measurement apparatus 200 used for capacitance-based monitoring at one or more stages of battery manufacturing according to one or more embodiments. Specifically, the capacitive measurement apparatus 200 may be reused or replicated for use at monitoring stages S1, S2, S3, and S4. FIG. 2A is a side view of the capacitive measurement apparatus 200 according to an exemplary embodiment.

The capacitive measurement apparatus 200 includes a first conductive plate(s) 210, a second conductive plate 250, and a capacitance, inductance, resistance (LCR) meter 260. In the exemplary illustration, the first conductive plate 210 is smaller than the second conductive plate 250 and both are smaller than the plate 240. FIGS. 2B and 2C show top-down views relative to the view in FIG. 2A. As shown in FIG. 2B, the first conductive plate 210 is rectangular. As shown in FIG. 2C, the first conductive plate 210 may be formed as multiple first conductive plates 210 that are circular. These exemplary embodiments are used to illustrate that the first conductive plate(s) 210 may be of any shape. The number and distribution of the first conductive plates 210 provides spatial resolution for the capacitive measurement.

An exemplary intermediate product 205 is shown to include a plate 240 with a coating 230. As indicated, this coating 230 is initially applied as a wet slurry coating 230a, at block 110, and is dried, at block 120, to result in the dried coating 230b. The exemplary intermediate product 205 shown in FIG. 2A is the result of the processes at blocks 110 and 120 being performed once (i.e., on one side of the plate 240). As previously noted, the processes at blocks 110 and 120 may be repeated to coat the other side of the plate 240, as well, and the result of that repetition may also be monitored using the capacitive measurement apparatus 200. Rather than at discrete monitoring stages S1 and S2, the capacitive measurement apparatus 200 may be used to continuously (e.g., periodically) monitor the intermediate product 205 during the drying process of the coating 230. This monitoring may be continued during the coating of the second side of the plate 240.

As shown, the first conductive plate 210 is held on one side of intermediate product 205 and the second conductive plate 250 is held on an opposite side of the intermediate product 205 with an airgap 220 (i.e., air) separating each conductive plate 210, 250 and the intermediate product 205. The frame that would hold the conductive plates 210, 250 in place is not shown. The airgaps 220 are a different dielectric material than the plate 240 and coating 230 and their capacitance contribution is known. According to the arrangement shown in FIG. 2, the capacitance Ceq measured by the LCR meter 260 is equivalent to the capacitances of the airgaps 220 (Cair1 and Cair2) and the capacitance of the intermediate product 205 (Cip) in series, and is obtained from:

$$\frac{1}{Ceq} = \sum \frac{1}{Cair1} + \frac{1}{Cair2} + \frac{1}{Cip} \qquad \text{[EQ. 2]}$$

Thus, because the capacitances of the airgaps 220 (Cair1 and Cair2) are known and the capacitance Ceq is measured by the LCR meter 260, the capacitance of the intermediate product 205 (Cip) may be determined from EQ. 2.

Once the capacitance of the intermediate product is known, based on EQ. 2, EQ. 1 may be used to determine thickness d or dielectric constant K, as needed. This is also true when the intermediate product is the result of repeating the processes at blocks 110 and 120 (i.e., coated plate 305 (FIG. 3)), a result of the processes at block 130 (in case of the monitoring at monitoring stage S3) (i.e., intermediate product 320 (FIG. 3)), and a result of the processes at block 140 (in the case of the monitoring at monitoring stage S4).

FIG. 3 shows aspects of a capacitive measurement apparatus 200 used at monitoring stage S3 for capacitance-based monitoring during a roll press process (at block 130) according to exemplary embodiments. The coated plate 305 results from applying and drying the coating 230 on both sides of the plate 240 (by performing the processes at blocks 110 and 120 twice). At block 130, a pair of rollers 310 arranged on either side of the coated plate 305 rolls across the coated plate 305, as indicated by the arrows, to produce the intermediate product 320. The spacing between the rollers 310 defines the thickness of the intermediate product 320, as illustrated in FIG. 3.

The capacitive measurement apparatus 200, as shown in FIG. 3, is arranged to measure the thickness of the intermediate product 320 that results from the roll press process. The conductive plates 210, 250 are held on either side of the intermediate product 320 with an airgap 220 between each conductive plate 210, 250 and the corresponding side of the intermediate product 320. As previously noted, the capacitance measured by the LCR meter 260 is equivalent to the known capacitances of the airgaps 220 and the capacitance of the intermediate product 320 in series. Thus, the capacitance of the intermediate product 320 may be determined using EQ. 2, and the thickness of the intermediate product 320 may be determined using EQ. 1.

As FIG. 3 shows, the processing circuitry 190 is coupled to the LCR meter 260. The processing circuitry 190 may determine the thickness of the intermediate product 320 based on EQS. 1 and 2. In addition, the processing circuitry 190 may provide a control signal S to adjust the spacing between the rollers 310, which defines that thickness, as needed. That is, the capacitive measurement apparatus 200 may facilitate feedback control to ensure correct thickness of the intermediate product 320, which eventually forms anodes 410 and cathodes 420.

Figure 4:
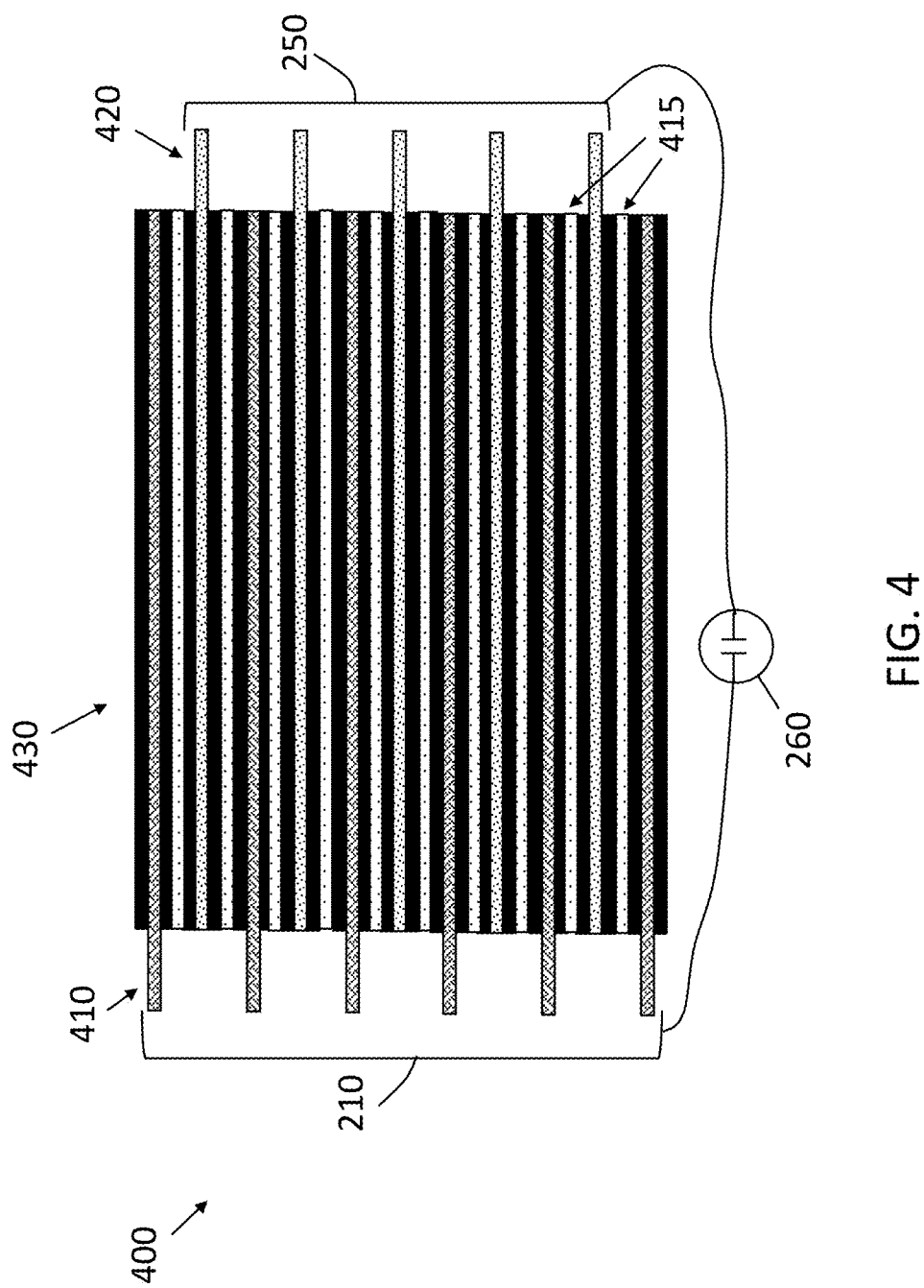
FIG. 4 shows aspects of an exemplary capacitive measurement apparatus used for capacitance-based monitoring at one or more stages of battery manufacturing according to one or more embodiments.

FIG. 4 shows aspects of a capacitive measurement apparatus 400 used for capacitance-based monitoring at one or more stages of battery manufacturing according to one or more embodiments. Specifically, the capacitive measurement apparatus 400 may be reused or replicated for use at monitoring stages S5 and S6. The stack 430 that results from the processes at block 150 is shown. The stack 430 includes anodes 410 and cathodes 420 in an alternating arrangement, as shown. Each of the anodes 410 and cathodes 420 are separated by a separator 415. The anodes 410 are taken together as the first conductive plate 210 and the cathodes 420 are taken together as the second conductive plate 250, as indicated. As previously noted, the capacitance measured by the LCR meter 260 will be affected by the overlapping area of the anodes 410 and cathodes 420.

Thus, the capacitance measured by the LCR meter 260 of the capacitive measurement apparatus 400 may be used for feedback of the processes at block 150. For example, the measured capacitance may be compared with an expected capacitance or a range of acceptable capacitance values. This acceptable capacitance or range may be based on proper stacking of the anodes 410 and cathodes 430 (e.g., proper sizing and arrangement to obtain the proper overlapping area). A measured capacitance that falls outside the acceptable capacitance or range may be used to make changes in the folding at block 150, for example. As another example, a measured capacitance that falls outside the acceptable capacitance or range may be used to identify batteries with defects such as broken joints or tabs.

FIG. 5 shows aspects of a capacitive measurement apparatus 500 used for capacitance-based monitoring at one or more stages of battery manufacturing according to one or more embodiments. Specifically, the capacitive measurement apparatus 500 may be reused or replicated for use at monitoring stages S6 and S7. The intermediate product 505 that results from the processes at block 160 is shown. According to the processes, the stack 430 is put in a pouch 510 and may additionally be packaged in a frame 520. At the monitoring stage S6, three sides are sealed for the intermediate product 505. As noted with reference to FIG. 4, the capacitive measurement apparatus 400, which uses the anodes 410 as the first conductive plate 210 and the cathodes 420 as the second conductive plate 250 may be used alternately at the monitoring stage S6. At the monitoring stage S7, which follows the processes at block 170, electrolyte 610 has been poured into the pouch, and the fourth side is also sealed.

As FIG. 5 indicates, the anodes 410 of the stack 430 are pinched together as the first conductive plate 210 while the frame 520 is used as the second conductive plate 250 of the capacitive measurement apparatus 500. In alternate embodiments, the cathodes 420 may be used as the first conductive plate 210 instead. The monitoring stage S6 may ensure that the processes at block 160 did not change the capacitance from the measurement performed at the monitoring stage S5, for example. After the electrolyte 610 (FIG. 6) is added at block 170, the capacitance measurement with the capacitive measurement apparatus 500 at monitoring stage S7 may be used to monitor diffusion of the electrolyte 610 into the layers of anodes 410 and cathodes 420.

This monitoring may include comparing the measured capacitance with expected capacitance ranges, for example. Typically, after the electrolyte 610 is introduced, formation (at block 180) is not initiated for a period of time (e.g., hours, days) to ensure that the electrolyte 610 has diffused. Based on the monitoring stage S7, the capacitive measurement that indicates readiness for the initiation of formation (at block 180) may be used as an indication of exactly when formation may be started, thereby saving time and associated cost.

Figure 6:
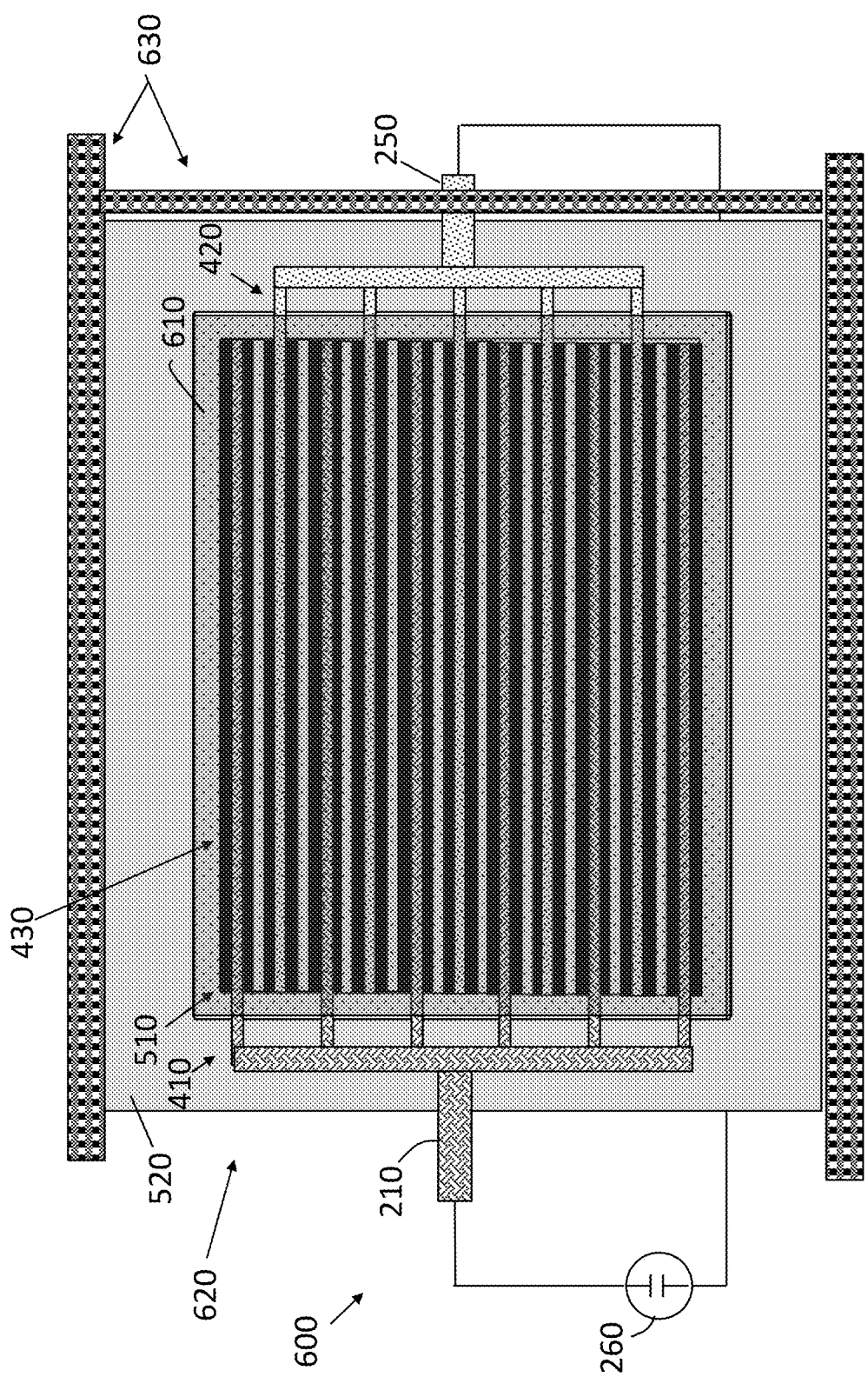
FIG. 6 shows aspects of an exemplary capacitive measurement apparatus used for capacitance-based monitoring at one or more stages of battery manufacturing according to one or more embodiments.

FIG. 6 shows aspects of a capacitive measurement apparatus 600 used for capacitance-based monitoring at one or more stages of battery manufacturing according to one or more embodiments. Specifically, the capacitive measurement apparatus 600 may be reused or replicated for use at monitoring stages S8 and S10. FIG. 6 shows the intermediate product 620 that results during the formation process at block 180. As previously noted, electrolyte 610 is poured into the pouch 510 as part of the processes at block 170. Then, the formation process (at block 180) involves charging the battery (i.e., driving current through the intermediate product 620).

As shown, the intermediate product 620 is held in a test fixture 630. The anodes 410 are pinched together and used as the first conductive plate 210 and the cathodes 420 are pinched together and used as the second conductive plate 250. The capacitance measured by the LCR meter 260 of the capacitive measurement apparatus 600, when compared by the processing circuitry 190 with expected values, indicates the status of the formation process (e.g., how much of the electrolyte 610 is being used). When the same or a similar capacitive measurement apparatus 600 is used at the monitoring stage S10, the capacitance of the completed battery is measured and may be compared with expected values to determine the quality of the battery.

Figure 7:
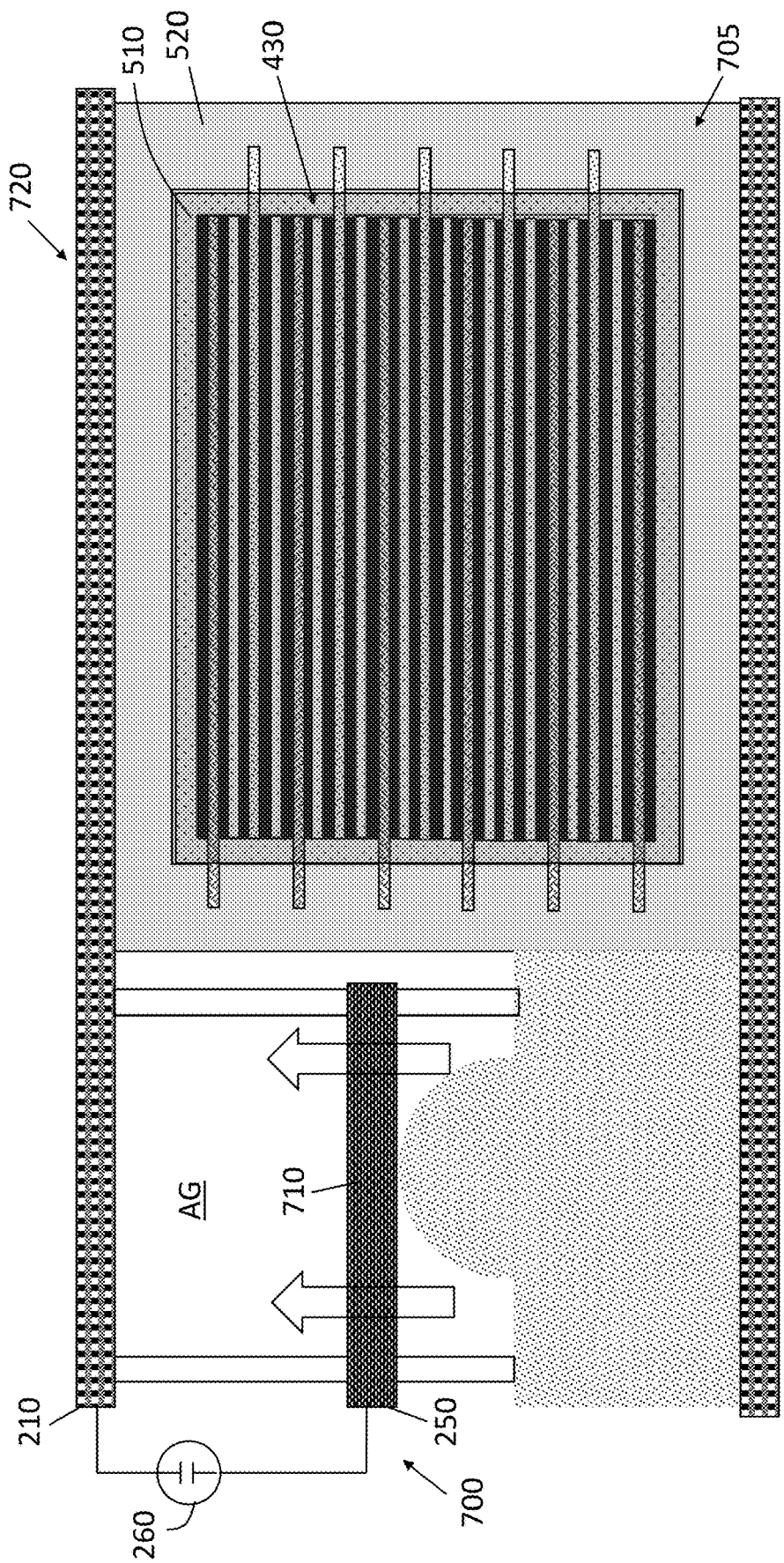
FIG. 7 shows aspects of an exemplary capacitive measurement apparatus used for capacitance-based monitoring at one or more stages of battery manufacturing according to one or more embodiments.

FIG. 7 shows aspects of a capacitive measurement apparatus 700 used for capacitance-based monitoring at one or more stages of battery manufacturing according to one or more embodiments. Specifically, the capacitive measurement apparatus 700 may be used at monitoring stage S9, which corresponds with the degassing process at block 180. Degassing refers to the release of gas generated during the formation process that is also part of the processes at block 180. The capacitive measurement apparatus 700 is used to infer the volume of gas that is generated.

As shown, the intermediate product 705 resulting at the end of the formation process is held in a fixture 720. The capacitive measurement apparatus 700 uses the fixture 720 as the first conductive plate 210 and uses a movable plate 710 as the second conductive plate 250. The movable plate 710 moves up, according to the arrangement shown in FIG. 7, as more gas is generated. When the movable plate 710 moves up, the distance between the conductive plates 210, 250 decreases, reducing the air gap AG and effecting the capacitance measured by the LCR meter 260. Thus, the volume of gas, which increases as the distance decreases, may be inferred from the measured capacitance. That is, the dielectric constant K of the air in the air gap AG is known and EQ. 1 may be used to solve for distance d. The gas volume and, more specifically, a comparison to an expected volume may be used to identify an issue (e.g., gas volume is below an expected value or range, indicating that nothing is happening, or gas volume exceeds an expected value or range, indicating a possible problem).

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A quality control system in a battery manufacturing process, the system comprising:
   two or more capacitive measurement apparatuses configured to obtain a capacitance measurement from two or more intermediate products generated during the battery manufacturing process; and
   processing circuitry configured to obtain the capacitive measurement from the two or more capacitive measurement apparatuses, to determine a characteristic of a corresponding intermediate product among the two or more intermediate products, to control at least one process of the battery manufacturing process that produced at least one of the two or more intermediate products based on the characteristic, and to estimate a volume of discharged gas based on the capacitance measurement.

2. The system according to claim 1, wherein one of the two or more capacitive measurement apparatuses includes one or more conductive plates arranged at a first side of the corresponding intermediate product and one or more conductive plates arranged at a second side of the corresponding intermediate product and also includes a meter configured to measure capacitance between the one or more conductive plates arranged at the first side and the one or more conductive plates arranged at the second side of the corresponding intermediate product.

3. The system according to claim 2, wherein the processing circuitry is configured to determine thickness of a portion of the corresponding intermediate product as the characteristic.

4. The system according to claim 3, wherein the processing circuitry is configured to determine the thickness of the portion of the corresponding intermediate product resulting from a roll press, the thickness indicating porosity and density.

5. The system according to claim 4, wherein the processing circuitry is configured to control pressure exerted by the roll press based on the thickness.

6. The system according to claim 3, wherein the one of the two or more capacitive measurement apparatuses include two or more conductive plates at the first side and one or more conductive plates at the second side of the corresponding intermediate product, and the processing circuitry is configured to determine the thickness of a wet slurry applied in an electrode coating process to produce the corresponding intermediate product.

7. The system according to claim 2, wherein the processing circuitry is configured to determine a dielectric constant of material in the corresponding intermediate product as the characteristic.

8. The system according to claim 7, wherein one of the two or more capacitive measurement apparatuses includes a meter configured to measure capacitance between anodes and cathodes formed for the battery.

9. The system according to claim 1, wherein one of the two or more capacitive measurement apparatuses includes a meter configured to measure capacitance between anodes or cathodes formed for the battery and a frame holding the intermediate product.

10. A quality control system in a battery manufacturing process, the system comprising:
    two or more capacitive measurement apparatuses configured to obtain a capacitance measurement from two or more intermediate products generated during the battery manufacturing process; and
    processing circuitry configured to obtain the capacitive measurement from the two or more capacitive measurement apparatuses, to determine a characteristic of a corresponding intermediate product among the two or more intermediate products, to control at least one process of the battery manufacturing process that produced at least one of the two or more intermediate products based on the characteristic, wherein one of the two or more capacitive measurement apparatuses includes a meter configured to measure capacitance between a movable plate and a frame, and the processing circuitry is configured to estimate a volume of discharged gas based on the capacitance.

11. A method of assembling a quality control system in a battery manufacturing process, the system comprising:
    arranging two or more capacitive measurement apparatuses to obtain a capacitance measurement from two or more intermediate products generated during the battery manufacturing process; and
    configuring processing circuitry to obtain the capacitive measurement from the two or more capacitive measurement apparatuses, to determine a characteristic of a corresponding intermediate product among the two or more intermediate products, to control at least one process of the battery manufacturing process that produced at least one of the two or more intermediate products based on the characteristic, and to estimate a volume of discharged gas based on the capacitance measurement.

12. The method according to claim 11, wherein the arranging the two or more capacitive measurement apparatuses includes one of the two or more capacitive measurement apparatuses including one or more conductive plates arranged at a first side of the corresponding intermediate product and one or more conductive plates arranged at a second side of the corresponding intermediate product and also includes a meter configured to measure capacitance between the one or more conductive plates arranged at the first side and the one or more conductive plates arranged at the second side of the corresponding intermediate product.

13. The method according to claim 12, wherein the configuring the processing circuitry includes the processing circuitry determining thickness of a portion of the corresponding intermediate product as the characteristic.

14. The method according to claim 13, wherein the configuring the processing circuitry includes the processing circuitry determining the thickness of the portion of the corresponding intermediate product resulting from a roll press, the thickness indicating porosity and density.

15. The method according to claim 14, wherein the configuring the processing circuitry includes the processing circuitry controlling pressure exerted by the roll press based on the thickness.

16. The method according to claim 13, wherein the arranging the two or more capacitive measurement apparatuses includes one of the two or more capacitive measurement apparatuses including two or more conductive plates at the first side and one or more conductive plates at the second side of the corresponding intermediate product, and the configuring the processing circuitry includes the processing circuitry determining the thickness of a wet slurry applied in an electrode coating process to produce the corresponding intermediate product.

17. The method according to claim 12, wherein the configuring the processing circuitry includes the processing circuitry determining a dielectric constant of material in the corresponding intermediate product as the characteristic.

18. The method according to claim 17, wherein the arranging the one of the two or more capacitive measurement apparatuses includes arranging a meter to measure capacitance between anodes and cathodes formed for the battery.

19. The method according to claim 11, wherein the arranging the two or more capacitive measurement apparatuses includes one of the two or more capacitive measurement apparatuses including a meter to measure capacitance between anodes or cathodes formed for the battery and a frame holding the intermediate product.

20. The method according to claim 11, wherein the arranging the two or more capacitive measurement apparatuses includes one of the two or more capacitive measurement apparatuses includes a meter to measure capacitance between a movable plate and a frame.

* * * * *